United States Patent [19]

Papanicolaou

[11] 4,425,195

[45] Jan. 10, 1984

[54] METHOD OF FABRICATING A DIAMOND HEAT SINK

[75] Inventor: Nicolas A. Papanicolaou, Silver Spring, Md.

[73] Assignee: Martin Marietta Corporation, Bethesda, Md.

[21] Appl. No.: 440,784

[22] Filed: Nov. 10, 1982

[51] Int. Cl.³ .................. C25D 1/20; C25D 5/02; C25D 5/12

[52] U.S. Cl. .................. 204/3; 204/15; 204/38 B; 204/40

[58] Field of Search .............. 204/16, 20, 3, 4, 38 B, 204/40, 15

[56] References Cited

U.S. PATENT DOCUMENTS

| | | | |
|---|---|---|---|
| 3,678,995 | 7/1972 | Collard | 165/185 |
| 3,721,289 | 3/1973 | Seal | 165/80 |
| 3,808,106 | 4/1974 | Gerkema | 204/16 |
| 3,828,848 | 8/1974 | Custers et al. | 165/80 |
| 3,859,180 | 1/1975 | Hasty | 204/16 |
| 3,949,263 | 4/1976 | Harper | 315/3.5 |

OTHER PUBLICATIONS

Seal, M. Diamond Heat Sinks for Semiconductor Devices, pp. 1–7, Brochure of D. Drukker and Zn. N.V.
Seal, M. Diamond Heat Sinks, Industrial Diamond Review 31, pp. 464–469, Nov. 1971.

*Primary Examiner*—T. M. Tufariello
*Attorney, Agent, or Firm*—Patrick M. Hogan; Gay Chin

[57] ABSTRACT

A method of fabricating a diamond heat sink which includes the steps of metalizing a diamond, temporarily attaching the diamond to a base plate, electroplating the exposed surfaces of the diamond with at least a primary metallic layer to provide a metallic base, and separating the base plate from the diamond thereby leaving the diamond heat sink.

11 Claims, 11 Drawing Figures

METHOD OF FABRICATING A DIAMOND HEAT SINK

BACKGROUND OF THE INVENTION

1. Field of the Invention

This invention relates to heat sinks for electronic devices and in particular to a new and improved method of fabricating a diamond heat sink.

2. Description of the Prior Art

The diamond heat sink has been found to be a very effective means of removing heat from adjacent components, such as small semiconductor diode chips. Typically, a diode chip is attached to a diamond which is imbedded in a metallic base, the diamond and metallic base being referred to as the diamond heat sink. When power is applied to the diode chip, it generates heat which, unless it is removed from the chip, can adversely affect useful life and operating performance. Since the diamond has very high thermal conductivity, it transmits the heat generated by the diode chip to the metallic base which in turn dissipates the heat to its surroundings.

Some performance deficiencies have been encountered with diamond heat sinks, however, as a result of the methods of attaching the diamond to its metallic base. One currently used method involves brazing the diamond to the surface of the metallic base. Since only one face of the diamond is in contact with the metallic base, however, the amount of heat that can be transmitted to the base is limited. Also, the filler metal used in the brazing interferes with the ability of the diamond to transmit heat to the base and thus reduces the efficiency of the heat sink.

Another currently used method of attaching the diamond to its metallic base is by hot pressing it into the base. This method provides greater contact and thus an increased capacity to transmit heat since the sides as well as the bottom face of the diamond are surrounded by the metallic base. However, since the hot pressing of the diamond into its base is a mechanical process, gaps tend to form between the diamond and the base which results in reduced heat transmitting efficiency. Also, because of the force required to press the diamond into its base, the metalized coating on the diamond, required for an electrical path between the diode chip and the base, is sometimes sheared. Further, the hot pressing may cause the metal in the metallic base, which is usually copper, to overflow and distort the surface of the base as it is displaced by the diamond.

In view of the above mentioned problems, it is therefore an object of the present invention to provide a method of fabricating a diamond heat sink which provides essentially gapless contact between the diamond and its base, thereby improving heat transfer efficiency between the two.

Another object of the present invention is to provide a method of fabricating a diamond heat sink which maintains a proper electrical path across the diamond metalized for that purpose.

Yet another object of the present invention is to provide a method of fabrication which does not distort the surface of the metallic base.

SUMMARY OF THE INVENTION

The present invention, in accordance with one form of the method thereof, comprises a method of fabricating a diamond heat sink and includes the steps of metalizing a diamond, temporarily attaching the diamond to a base plate, coating the exposed surfaces of the diamond with a primary metallic layer to provide a metallic base, and separating the base plate from the diamond, thereby leaving the diamond heat sink.

In a particular form of the method, the diamond is temporarily attached to the base plate with a wax bond and is coated with at least one additional metallic layer to protect the primary metallic layer.

BRIEF DESCRIPTION OF THE DRAWING

This invention will be better understood from the following description taken in conjunction with the accompanying drawing, wherein.

DESCRIPTION OF THE PREFERRED METHOD

Figure 1:
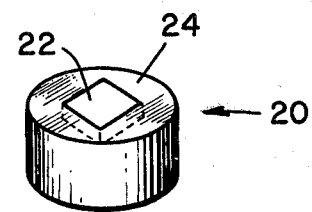
FIG. 1 is a perspective view of a diamond heat sink made in accordance with the method of the present invention.
Figure 2:
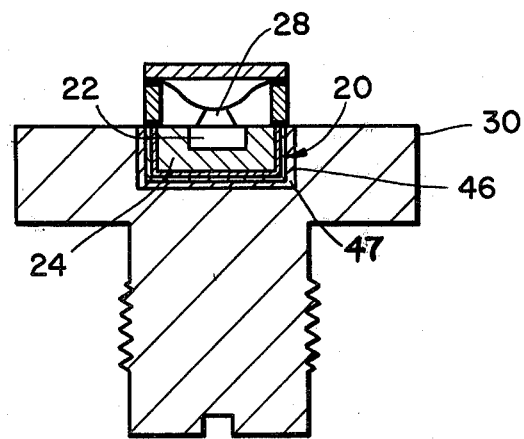
FIG. 2 is a cross-sectional view of a diamond heat sink employed in a diode assembly and mounted on a stud.
Figure 2A:
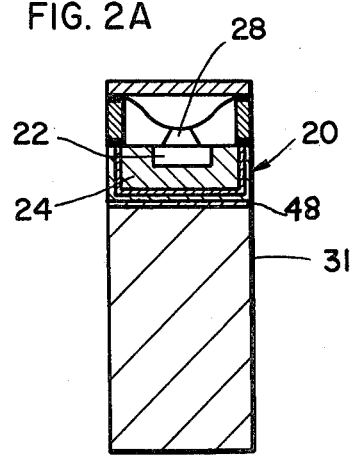
FIG. 2A shows the diode assembly mounted on a metallic pin.

Turning now to a consideration of the drawing, and in particular to FIG. 1, there is shown a diamond heat sink 20 made in accordance with the method of the present invention. The diamond heat sink 20 comprises a diamond 22 embedded in a metallic base 24, the base comprising one or more layers of metal. Since diamonds have a very high thermal conductivity, the diamond heat sink 20 can be used to efficiently remove heat from adjacent components. For example, turning to FIG. 2, a semiconductor diode chip 28 is shown mounted on the diamond 22. During operation, the diode chip 28 generates heat which must be removed from it in order to extend the useful life of the chip. The heat removal function is performed by the diamond heat sink 20. The diamond 22 is employed not to absorb the heat but rather to transmit it from the diode chip 28 to the more massive metallic base 24 which in turn dissipates the heat by passing it to its surroundings. In the example of FIG. 2, the diamond heat sink 20 is itself disposed in an even more massive receptacle, a metallic stud 30, which not only efficiently absorbs heat from the metallic base 24 but also acts as a support for the entire diode package. Similarly, FIG. 2A shows the heat sink 20 disposed on a different receptacle, a metallic pin 31, which performs functions similar to that of the stud 30.

The diamond 22 used in the diamond heat sink 20 can be any type of diamond, however, a type 2A diamond is preferred. Diamonds are divided into types 1 and 2 and those types subdivided into types A and B. Type 2 diamonds have higher heat conductivity than type 1 diamonds because of fewer impurities and are therefor more desirable for heat sinks. Type 2A diamonds are electrical insulators while type 2B diamonds have a trace of an impurity which makes them electrical semiconductors. The diamond 22 can also have any shape, although the most common shapes are square or round.

The first step in the method of fabricating the diamond heat sink 20 is to metalize the diamond 22 in any appropriate manner, such as by evaporation, sputtering, or any other desired technique. The purpose of the metallic coating is to provide an electrical path across the diamond 22. For example, the diamond shown in FIG. 2 was metalized with titanium (Ti), platinum (Pt) and gold (Au) to the thicknesses of 300 Angstroms (Å), 600 Å and 10,000 Å, respectively, although any other suitable metallic coating could also be used. Thus, in the diode chip arrangement shown in FIG. 2, the metalization of the diamond 22 provides an electrical path between the diode chip 28 and the metallic base 24. The metalization also facilitates the mounting of the diode chip 28 on the diamond 22.

Figure 3:
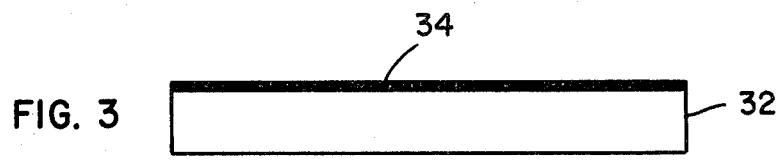
FIG. 3 is a view of a base plate to which diamonds are to be attached.

The diamond 22 is next temporarily attached in any suitable manner, such as with a bonding material, to a base plate 32. For example, the base plate 32 shown in FIG. 3 was coated with a layer of wax 34 dissolved in trichloroethylene (TCE) and spun onto the base plate 32, made of glass, rotating at about 2,000 RPM. The wax was then allowed to dry.

Figure 5:
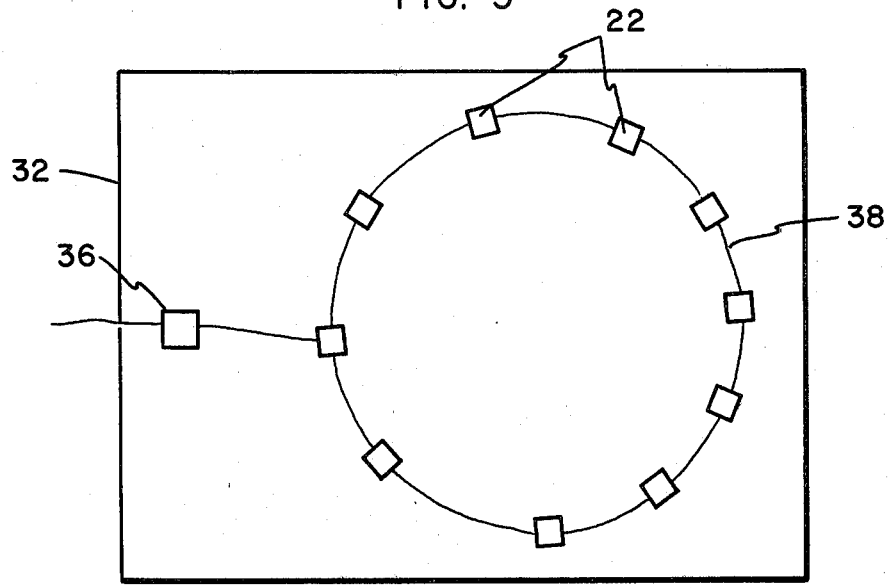
FIG. 5 is a top view of a pattern of diamonds connected by an electrical wire.
Figure 4:
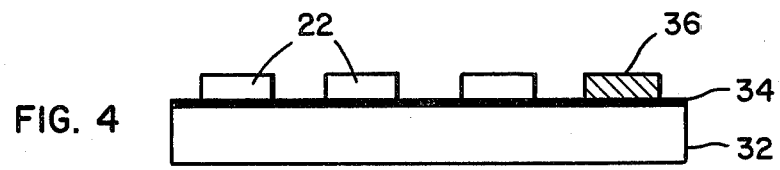
FIG. 4 shows the diamonds attached to the base plate.

The diamond 22 is then placed on the layer of wax 34, as is shown in FIG. 4. When it is desired to fabricate a plurality of diamond heat sinks 20 at the same time, the appropriate number of diamonds 22 are placed on the layer of wax 34, such as in the circular pattern shown in FIG. 5. As will be discussed in a subsequent step, a common electrode such as a thin metal pad 36, can also be placed on the layer of wax 34. The diamonds 22 and the wax 34 are then heated such that the wax melts allowing the diamonds to sink into the wax and abut the base plate 32. Next, the diamonds and the wax are allowed to cool which resolidifies the wax, bonding the diamonds 22 to the base plate 32.

Bonding materials other than wax, such as chemical adhesives, can also be employed to temporarily attach the diamond 22 to the base plate 32. Such alternate bonding materials may not require the above described heating and cooling steps used with the wax.

Figure 6:
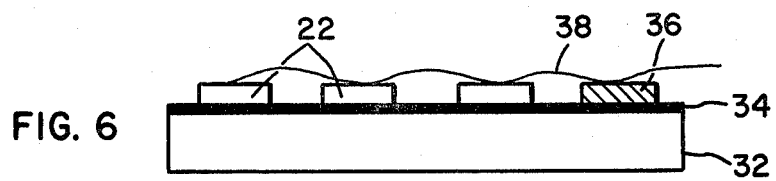
FIG. 6 is a side view of the diamonds connected by an electrical wire.
Figure 7:
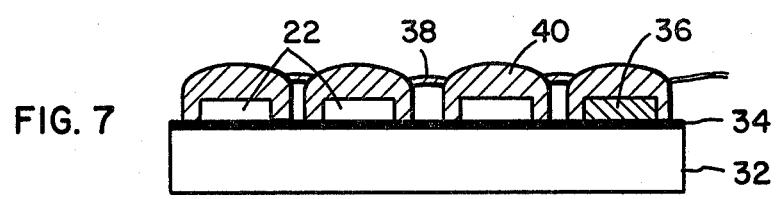
FIG. 7 shows the diamonds with a primary metallic layer thereon.

The next step of fabrication is to coat the exposed surfaces of each of the diamonds 22 with a primary metallic layer. This primary metallic layer is substantially thicker than the coating applied to each diamond 22 when it was metalized in the first step. One suitable manner of coating the diamonds with the primary metallic layer is by electroplating. To facilitate the electroplating, an electrical wire 38, shown in FIGS. 5 and 6, which can for example be made of gold, is connected to each diamond 22 and to the metal pad 36 such as with a thermal compression bonding machine. The base plate 32 and the exposed surfaces of the diamonds 22 mounted thereon are then electroplated with a primary metallic layer 40, shown in FIG. 7, using conventional electroplating methods, the electrical wire 38 being connected to an electrode of a power source. In this example, a primary metallic layer of copper of a thickness of about 0.025 cm was electroplated onto the diamonds from a Cubath-M plating solution.

The primary metallic layer 40 comprises the main portion of the metallic base 24 (shown in FIG. 1). By coating each of the diamonds 22 with the primary metallic layer 40, rather than by brazing or hot pressing the two together as in previous methods, there results an essentially gapless contact between the two which improves the efficiency of heat transfer from the diamond to the metallic base.

Figure 8:
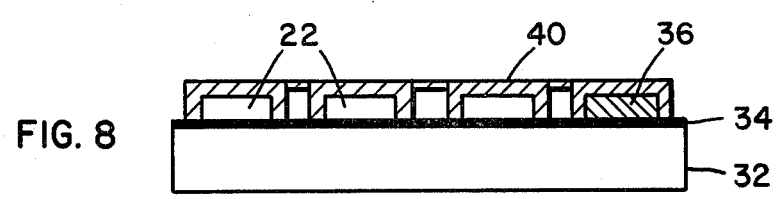
FIG. 8 shows the primary metallic layer after it has been lapped and prepared for a secondary metallic layer.

The next step of fabrication is to grind down, or lap, the primary metallic layer 40 on each diamond 22 until it is substantially flat and of a desired thickness, as can be seen in FIG. 8. The lapping can be accomplished manually or using any appropriate mechanical grinding machine.

Figure 9:
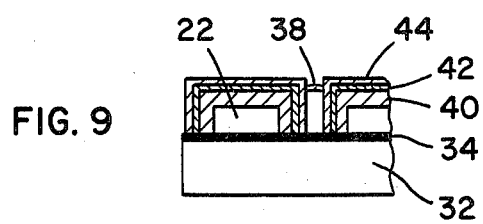
FIG. 9 shows a diffusion barrier and a secondary metallic layer on the diamonds.

Preferably, a secondary metallic layer is plated over the primary metallic layer 40 in order to facilitate its bonding on the metallic stud 30 or the metallic pin 31 and to protect the primary layer. Prior to that step, however, if the metals in the two layers would tend to diffuse into each other when they are heated, a diffusion barrier 42, shown in FIG. 9, is first deposited by electroplating over the primary metallic layer 40. When the primary and secondary metallic layers are copper and gold, respectively, an example of a suitable material for the diffusion barrier is nickel.

The secondary metallic layer 44, shown in FIG. 9, is next electroplated over the diffusion barrier 42. Although any suitable metal can be used, the secondary metallic layer 44 of FIG. 9 was gold, plated to a thickness of approximately 1 $\mu$m, gold being chosen primarily to reduce oxidation of the primary metallic layer 40 and to permit a strong gold-to-gold bond between the diamond heat sink 20 and a metallic stud or pin, as will be more fully explained hereinafter.

Figure 10:
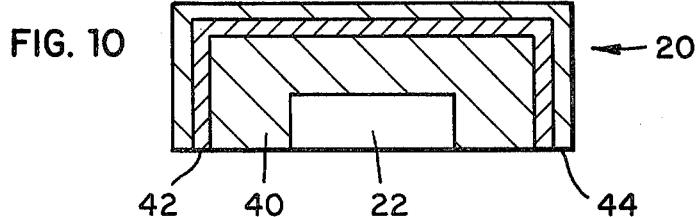
FIG. 10 is an enlarged view of the diamond heat sink.

The next step of fabrication is to separate the base plate 32 from the diamond 22, thereby leaving the diamond 22 and its metallic layers which together comprise the diamond heat sink 20. The separation is accomplished by dissolving the bonding material in a suitable solvent, thus removing the bond between the diamonds 22 and the base plate 32. When the bonding material is wax, a suitable solvent is trichloroethylene (TCE). Each diamond 22 is separated from the other diamonds by cutting the electric wire 38. The result is the diamond heat sink 20 shown in FIG. 10. As can be seen, the surfaces of the primary and secondary metallic layers 40 and 44 adjacent the diamond 22 are smooth, rather than distorted as sometimes resulted from previous methods of fabrication, permitting other components to be easily mounted thereon.

Returning to FIG. 2, when the diamond heat sink 20 is to be combined with a larger heat sink, such as the metallic stud 30, it is sized and shaped during its fabrication such that it can be received in the recess 46 of the metalic stud 30. The surfaces of the recess 46 are preferably coated with gold 47 when the secondary metallic layer 44 is gold such that a strong gold-to-gold bond can be achieved between the diamond heat sink 20 and the metallic stud 30.

Similarly, when the diamond heat sink 20 is to be combined with a metallic pin 31 shown in FIG. 2A, the heat sink is sized and shaped to fit the end of the pin. Correspondingly, the end of the metallic pin is preferably coated with gold when the secondary metallic layer 44 of the heat sink is gold 48 to provide a gold-to-gold bond.

It is to be understood that the method of this invention is not limited to the particular forms disclosed and it is intended to cover all modifications coming within the true spirit and scope of this invention as claimed.

What is claimed is:

1. A method of fabricating a diamond heat sink comprising the steps of:
   (a) metalizing a diamond;
   (b) temporarily attaching said diamond to a base plate;
   (c) coating the exposed surfaces of said diamond with a primary metallic layer to provide a metallic base; and
   (d) separating said base plate from said diamond thereby leaving as a diamond heat sink said diamond and said primary metallic layer.

2. The method of claim 1 wherein the temporary attaching of said diamond to said base plate comprises placing said diamond on a layer of a meltable bonding material and then heating and cooling said diamond and said bonding material.

3. The method of claim 1 wherein said coating of step (c) comprising electroplating and wherein said method comprises an additional step between steps (b) and (c) of connecting an electrical wire to said diamond for facilitating the electroplating thereof.

4. The method of claim 1 comprising an additional step between steps (c) and (d) of lapping said primary metallic layer to a desired thickness.

5. A method of fabricating a diamond heat sink comprising the steps of:
   (a) metalizing a diamond;
   (b) coating a base plate with a layer of a bonding material;
   (c) placing said diamond on said layer of bonding material in a manner to thereby bond said diamond to said base plate;
   (d) connecting an electrical wire to said diamond;
   (e) connecting said electrical wire to an electrode and electroplating the exposed surface of said diamond with a primary metallic layer to provide a metallic base;
   (f) lapping said primary metallic layer to a desired thickness;
   (g) electroplating said diamond with a secondary metallic layer over said primary metallic layer;
   (h) dissolving said layer of bonding material on said base plate thereby separating said base plate from said diamond and leaving said diamond heat sink, comprising said diamond and the metallic layers thereon.

6. The method of claim 5 comprising an additional step between steps (g) and (h) of electroplating a diffusion barrier on said diamond between said primary and said secondary metallic layers.

7. The method of claim 5 wherein said diamond heat sink is sized and shaped for being received in a larger heat sink.

8. The method of claim 5 wherein said bonding material comprises wax and wherein in step (c) said diamond and said wax are heated and then cooled to bond said diamond to said base plate.

9. The method of claim 5 wherein a plurality of diamond heat sinks are fabricated at the same time on a common base plate, an electrical wire network connecting said diamonds for facilitating the electroplating thereof.

10. The method of claim 5 wherein said primary metallic layer comprises copper and said secondary metallic layer comprises gold.

11. The method of claim 10 wherein said diffusion barrier is nickel.

* * * * *